(12) United States Patent
Xu (10) Patent No.: US 11,842,995 B2
(45) Date of Patent: Dec. 12, 2023

(54) ESD PROTECTION CIRCUIT AND SEMICONDUCTOR DEVICE

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/453,910

(22) Filed: Nov. 8, 2021

(65) Prior Publication Data

US 2022/0293586 A1    Sep. 15, 2022

Related U.S. Application Data

(63) Continuation of application No. PCT/CN2021/106499, filed on Jul. 15, 2021.

(30) Foreign Application Priority Data

Mar. 10, 2021  (CN) .......................... 202110260635.5

(51) Int. Cl.
*H01L 27/02*  (2006.01)
*H02H 9/04*  (2006.01)

(52) U.S. Cl.
CPC ......... *H01L 27/0266* (2013.01); *H02H 9/046* (2013.01)

(58) Field of Classification Search
CPC .................................................... H02H 9/046
USPC .......................................................... 361/56
See application file for complete search history.

(56) References Cited

U.S. PATENT DOCUMENTS

| | | | |
|---|---|---|---|
| 5,784,242 A * | 7/1998 | Watt | ................... H01L 27/0251 361/111 |
| 6,577,480 B1 * | 6/2003 | Avery | ................. H01L 27/0266 361/111 |
| 7,098,717 B2 | 8/2006 | Watt | |
| 7,782,583 B2 | 8/2010 | Moon | |
| 7,903,380 B2 | 3/2011 | Jing | |

(Continued)

FOREIGN PATENT DOCUMENTS

| | | | | |
|---|---|---|---|---|
| CN | 101707196 A | | 5/2010 | |
| CN | 103219720 A * | | 7/2013 | ............. H02H 9/046 |

(Continued)

OTHER PUBLICATIONS

Supplementary European Search Report in the European application No. 21893124.4, dated May 19, 2023. 7 pages.

(Continued)

*Primary Examiner* — Dharti H Patel
(74) *Attorney, Agent, or Firm* — SYNCODA LLC; Feng Ma (57) ABSTRACT

An electro-static discharge (ESD) protection circuit is electrically connected to a first pad and a second pad. The ESD protection circuit includes an ESD transistor having a control terminal, a first terminal electrically connected to the first pad, a second terminal electrically connected to the second pad, and a substrate end; and an electro-static pulse detection circuit having an upper terminal electrically connected to the first pad, a lower terminal electrically connected to the second pad, and an output terminal electrically connected to the control terminal and the substrate end of the ESD transistor.

16 Claims, 12 Drawing Sheets

(56) References Cited

U.S. PATENT DOCUMENTS

| | | | |
|---|---|---|---|
| 8,643,988 B1* | 2/2014 | Kwong | H02H 9/046 361/118 |
| 9,001,479 B2* | 4/2015 | Chuang | H01L 27/0277 361/56 |
| 9,978,743 B1* | 5/2018 | Loiseau | H03K 19/00315 |
| 10,177,137 B1* | 1/2019 | Altolaguirre | H01L 27/0281 |
| 10,242,978 B1 | 3/2019 | Liu | |
| 10,447,032 B2* | 10/2019 | Lu | H02H 9/008 |
| 11,088,542 B1* | 8/2021 | Langguth | H01L 27/0288 |
| 2003/0076636 A1* | 4/2003 | Ker | H01L 27/0262 361/56 |
| 2003/0133237 A1* | 7/2003 | Hung | H01L 27/0266 361/56 |
| 2004/0125521 A1* | 7/2004 | Salling | H01L 27/0285 361/56 |
| 2006/0044716 A1* | 3/2006 | Kuo | H01L 27/0266 361/56 |
| 2007/0183104 A1 | 8/2007 | Tseng | |
| 2008/0179681 A1 | 7/2008 | Kwak | |
| 2008/0239599 A1* | 10/2008 | Yizraeli | H02H 9/046 361/56 |
| 2008/0259512 A1* | 10/2008 | Moon | H01L 27/0255 361/56 |
| 2010/0246079 A1* | 9/2010 | Suzuki | H01L 27/0285 257/E29.242 |
| 2015/0318275 A1* | 11/2015 | Chen | H01L 27/0285 361/56 |
| 2018/0211949 A1 | 7/2018 | Uzawa | |
| 2019/0131294 A1 | 5/2019 | Liu | |
| 2020/0091712 A1* | 3/2020 | Lu | H02H 9/005 |
| 2020/0294994 A1* | 9/2020 | Chen | H03K 17/08104 |

FOREIGN PATENT DOCUMENTS

| | | | | |
|---|---|---|---|---|
| CN | 103412216 A | | 11/2013 | |
| CN | 103840440 A | | 6/2014 | |
| CN | 105098743 A | * | 11/2015 | ......... H01L 27/0251 |
| CN | 109672163 A | | 4/2019 | |
| CN | 111697549 A | | 9/2020 | |
| JP | 2016036958 A | | 3/2016 | |
| JP | 2016100525 A | | 5/2016 | |
| JP | 2018120955 A | | 8/2018 | |
| KR | 20130084934 A | | 7/2013 | |
| TW | 502428 A | * | 9/2002 | ......... H01L 27/0266 |
| TW | 201409654 A | * | 3/2014 | ............ H02H 9/046 |

OTHER PUBLICATIONS

First Office Action of the Japanese application No. 2022-547945, dated Oct. 17, 2023, 7 pages with English translation.

* cited by examiner

ESD PROTECTION CIRCUIT AND SEMICONDUCTOR DEVICE

CROSS-REFERENCE TO RELATED APPLICATIONS

This is a continuation of International Application No. PCT/CN2021/106499 filed on Jul. 15, 2021, which claims priority to Chinese Patent Application No. 202110260635.5 filed on Mar. 10, 2021. The disclosures of these applications are hereby incorporated by reference in their entirety.

BACKGROUND

In recent years, with the rapid development of integrated circuit technology, a line width of a metal oxide semiconductor (MOS) transistor has become narrower and narrower, a junction depth has become shallower and shallower, and a thickness of a gate oxide layer has become less and less. These have increased a need of a circuit design for electrostatic discharge (ESD) protection. When the line width is 1 µm, an ESD event has little impact on a circuit, when the line width is 0.18 µm or 0.13 µm, especially when the line width is less than 90 nm, ESD has become an urgent problem.

SUMMARY

The present disclosure relates to the technical field of integrated circuits, and in particular to an ESD protection circuit and a semiconductor device.

According to some embodiments of the present disclosure, a first aspect of the present disclosure provides an ESD protection circuit electrically connected to a first pad and a second pad. The ESD protection circuit includes: an ESD transistor having a control terminal, a first terminal electrically connected to the first pad, a second terminal electrically connected to the second pad and a substrate end; and an electro-static pulse detection circuit having an upper terminal electrically connected to the first pad, a lower terminal electrically connected to the second pad, and an output terminal electrically connected to the control terminal and the substrate end.

According to some embodiments of the present disclosure, a second aspect of the present disclosure further provides a semiconductor device including an ESD protection circuit electrically connected to a first pad and a second pad, where the ESD protection circuit includes: an ESD transistor having a control terminal, a first terminal electrically connected to the first pad, a second terminal electrically connected to the second pad, and a substrate end; and an electro-static pulse detection circuit having an upper terminal electrically connected to the first pad, a lower terminal electrically connected to the second pad, and an output terminal electrically connected to the control terminal and the substrate end of the ESD transistor.

BRIEF DESCRIPTION OF THE DRAWINGS

In order to describe the technical solutions of the embodiments of the present disclosure more clearly, drawings required to be used in the embodiments of the present disclosure will be briefly introduced below. Apparently, the drawings described below are only some embodiments of the present disclosure. Those of ordinary skill in the art also can obtain other drawings according to these drawings without doing creative work.

DETAILED DESCRIPTION

In order to make the objectives, technical solutions, and advantages of the embodiments of the present disclosure clearer, the technical solutions in the embodiments of the present disclosure will be clearly and completely described below with reference to the drawings in the embodiments of the present disclosure. It is apparent that the described embodiments are a part of the embodiments of the present disclosure, not all of the embodiments. All other embodiments obtained by those of ordinary skill in the art based on the embodiments of the present disclosure without creative efforts should fall within the scope of protection of the present disclosure.

Figure 1A:
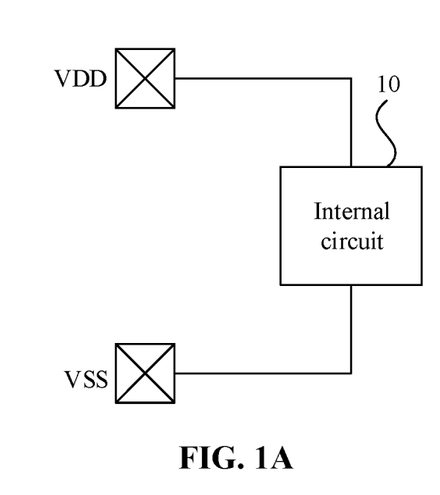
FIG. 1A is a schematic structural diagram of a circuit in some implementations.

FIG. 1A is a schematic structural diagram of a circuit in some implementations. Referring to FIG. 1A. An internal circuit 10 is electrically connected to a first pad VDD and a second pad VSS, respectively. When static electricity is generated on one pad (such as the first pad VDD), the static electricity will flow through the internal circuit 10, thereby causing the internal circuit 10 to be damaged by the static electricity.

Figure 1B:
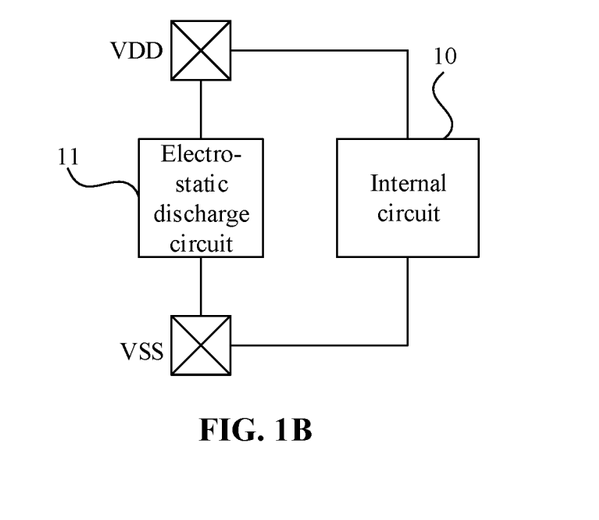
FIG. 1B is a schematic structural diagram of a circuit provided with an ESD protection circuit in some implementations.

In order to prevent the internal circuit from being damaged by the static electricity, a clamp circuit including a clamp transistor is usually used as a protection solution for an electro-static discharge (ESD) protection circuit. FIG. 1B is a schematic structural diagram of a circuit provided with an ESD protection circuit in some implementations. Referring to FIG. 1B, the internal circuit 10 is electrically connected to the first pad VDD and the second pad VSS, and an ESD protection circuit 11 is also electrically connected to the first pad VDD and the second pad VSS, that is, the ESD protection circuit 11 is connected in parallel with the internal circuit 10. When static electricity is generated on one pad (for example, the first pad VDD), the static electricity will be discharged through the ESD protection circuit 11 instead of flowing through the internal circuit 10, thereby protecting the internal circuit 10 and avoiding the internal circuit 10 from being damaged by the static electricity.

However, the ESD protection circuit can have a large error in identifying normal power-on and electro-static power-on, which may cause a false start, and the typical ESD protection circuit cannot fully discharge the electro-static charges.

Figure 2:
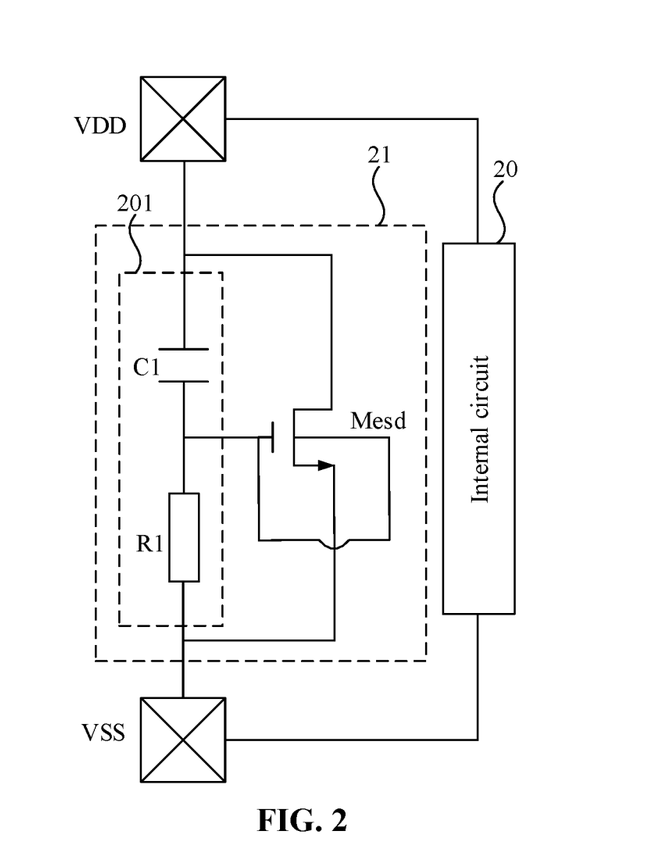
FIG. 2 is a schematic diagram of application of an ESD protection circuit according to a first embodiment of the present disclosure.

FIG. 2 is a schematic diagram of application of an ESD protection circuit according to a first embodiment of the present disclosure. Referring to FIG. 2, an internal circuit 20 is electrically connected to a first pad VDD and a second pad VSS, respectively, and an ESD protection circuit 21 is also electrically connected to the first pad VDD and the second pad VSS, respectively, that is, the ESD protection circuit 21 is connected in parallel with the internal circuit 20. When static electricity is generated on one of the pads (for example, the first pad VDD), the static electricity will be discharged through the ESD protection circuit 21 instead of flowing through the internal circuit 20, thereby protecting the internal circuit 20 and avoiding the internal circuit 20 from being damaged by the static electricity.

In the present embodiment, the first pad VDD is a power pad, and the second pad VSS is a ground pad. In other embodiments of the present disclosure, the first pad is a ground pad, and the second pad is a power pad, or both of them are power pads or ground pads.

The ESD protection circuit 20 of the present disclosure includes an ESD transistor Mesd and an electro-static pulse detection circuit 201. The ESD transistor Mesd has a control terminal, a first terminal, a second terminal and a substrate end. The first terminal is electrically connected to the first pad VDD, and the second terminal is electrically connected to the second pad VSS. The electro-static pulse detection circuit 201 has an upper terminal, a lower terminal and an output terminal. The upper terminal is electrically connected to the first pad VDD, and the lower terminal is electrically connected to the second pad VSS. The output terminal is electrically connected to the control terminal and the substrate end of the ESD transistor Mesd.

According to the present disclosure, the electro-static pulse detection circuit 201 detects a pulse to distinguish a normal power-on pulse and an electro-static power on pulse of a power supply, thereby avoiding false start of the ESD protection circuit. The electro-static pulse detection circuit 201 is configured to prolong the delay time, so that the ESD transistor fully discharges the electro-static charges. In addition, the output terminal of the electro-static pulse detection circuit 201 is electrically connected to the control terminal and the substrate end of the ESD transistor Mesd, that is, the control terminal and the substrate end of the ESD transistor Mesd are short-circuited, thus increasing the potential of the substrate end, so that a threshold voltage of the ESD transistor Mesd is reduced, and the trench conductivity is improved. When static electricity is generated, the electro-static charges can be quickly discharged by the ESD transistor Mesd, so that the electro-static charge discharge performance of the ESD protection circuit is improved.

In the present embodiment, the ESD transistor Mesd is a Negative channel Metal Oxide Semiconductor (NMOS) transistor. A first terminal of the NMOS transistor is electrically connected to the first pad VDD, and a second terminal of the NMOS transistor is electrically connected to the second pad VSS. The first terminal of the NMOS transistor is a source terminal of the NMOS transistor, and the second terminal of the NMOS transistor is a drain terminal of the NMOS transistor. Or, the first terminal of the NMOS transistor is a drain terminal of the NMOS transistor, and the second terminal of the NMOS transistor is a source terminal of the NMOS transistor. The present disclosure does not limit this.

In the present embodiment, the electro-static pulse detection circuit 201 includes a capacitor C1 and a resistor R1. The capacitor C1 has a first terminal and a second terminal. The first terminal of the capacitor C1 serves as the upper terminal of the electro-static pulse detection circuit 201, that is, the first terminal of the capacitor C1 is electrically connected to the first pad VDD. The resistor R1 has a first terminal and a second terminal. The first terminal of the resistor R1 serves as the lower terminal of the electro-static pulse detection circuit 201, that is, the first terminal of the resistor R1 is electrically connected to the second pad VSS. The second terminal of the resistor R1 and the second terminal of the capacitor C1 jointly serve as the output terminal of the electro-static pulse detection circuit 201, that is, the second terminal of the resistor R1 and the second terminal of the capacitor C1 are jointly electrically connected to the control terminal and the substrate end of the ESD transistor Mesd.

In the first embodiment, when the first pad VDD and the second pad VSS are normally initiated and normally work, the control terminal of the ESD transistor Mesd is at a low level, the ESD transistor Mesd is turned off, and a current flows through the internal current 20 to ensure the normal operation of the internal circuit 20. When the first pad VDD generates static electricity, a voltage of the first pad VDD starts to rise. At this time, the control terminal of the ESD transistor Mesd is at a high level, then the ESD transistor Mesd is turned on, and the electro-static charges flow through the ESD transistor Mesd and are discharged to prevent the internal circuit 20 from being damaged by the static electricity.

The present disclosure further provides a second embodiment. A difference between the second embodiment and the first embodiment is that the capacitor and resistor of the electro-static pulse detection circuit 201 are connected in a different way. Specifically, referring to FIG. 3, a schematic diagram of application of an ESD protection circuit according to a second embodiment of the present disclosure is illustrated. In this embodiment, the electro-static pulse detection circuit 201 includes a resistor R1, a capacitor C1, and an inverter P1.

Figure 3:
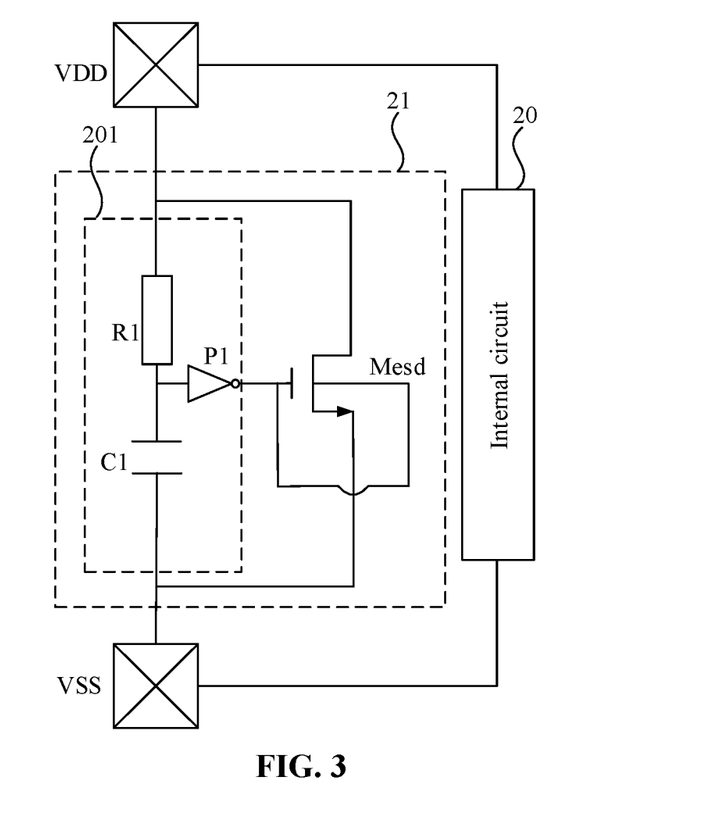
FIG. 3 is a schematic diagram of application of an ESD protection circuit according to a second embodiment of the present disclosure.

The resistor R1 has a first terminal and a second terminal. The first terminal of the resistor R1 serves as the upper terminal of the electro-static pulse detection circuit 201, that is, the first terminal of the resistor R1 is electrically connected to the first pad VDD. The capacitor C1 has a first terminal and a second terminal. The first terminal of the capacitor C1 serves as the lower terminal of the electro-static pulse detection circuit 201, that is, the first terminal of the capacitor C1 is electrically connected to the second pad VSS. The inverter P1 has an input terminal and an output terminal. The second terminal of the resistor R1 and the second terminal of the capacitor C1 are electrically connected to the input terminal of the inverter P1. The output terminal of the inverter P1 serves as the output terminal of the electro-static pulse detection circuit 201, that is, the output terminal of the inverter P1 is electrically connected to the control terminal and the substrate end of the ESD transistor Mesd.

In the second embodiment, when the first pad VDD and the second pad VSS are normally initiated and normally work, the control terminal of the ESD transistor Mesd is at a low level, the ESD transistor Mesd is turned off, and a current flows through the internal current 20 to ensure the normal operation of the internal circuit 20. When the first pad VDD generates static electricity, a voltage of the first pad VDD starts to rise. When the voltage rises till the inverter P1 can work, the control terminal of the ESD transistor Mesd is at a high level, then the ESD transistor Mesd is turned on, and the electro-static charges flow through the ESD transistor Mesd and are discharged to prevent the internal circuit 20 from being damaged by the static electricity.

In the first and second embodiments, in order to distinguish whether it is static electricity or a transient state of power startup, and to ensure that the Mesd can fully discharge the electro-static charges within the time when the static electricity is generated, the RC time constant is usually 0.1-1 micro second. For example, R1 is a 50K ohm N+ diffused resistor, and C1 is a 20PF NMOS capacitor. However, the applicant found that such a RC time constant design would occupy a relatively large layout space and also cause a relatively high leakage current.

In order to solve the above problems, the present disclosure further provides a third embodiment, which can reduce the occupied layout space and greatly reduce the leakage current while keeping the original RC time constant unchanged.

Figure 4:
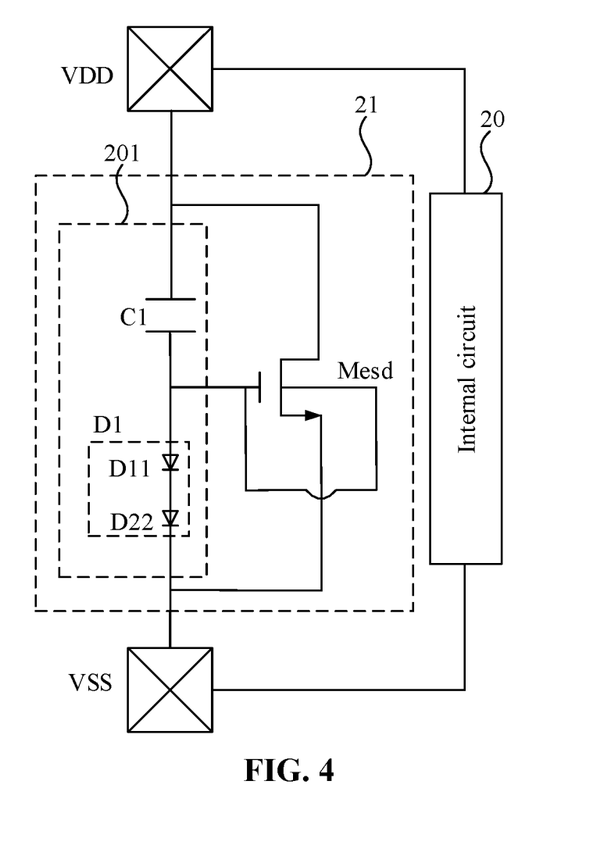
FIG. 4 is a schematic diagram of application of an ESD protection circuit according to a third embodiment of the present disclosure.

FIG. 4 is a schematic diagram of the ESD protection circuit according to the third embodiment of the present disclosure. Referring to FIG. 4, in the third embodiment, the electro-static pulse detection circuit 201 includes a capacitor C1 and a diode group D1. The capacitor C1 has a first terminal and a second terminal. The first terminal of the capacitor C1 serves as the upper terminal of the electro-static pulse detection circuit 201, that is, the first terminal of the capacitor C1 is electrically connected to the first pad VDD. The diode group D1 has a first terminal and a second terminal. The first terminal of the diode group D1 serves as the lower terminal of the electro-static pulse detection circuit 201, that is, the first terminal of the diode group D1 is connected electrically connected to the second pad VSS. The second terminal of the diode group D1 and the second terminal of the capacitor C1 jointly serve as the output terminal of the electro-static pulse detection circuit 201, that is, the second terminal of the diode group D1 and the second terminal of the capacitor C1 jointly electrically connected to the control terminal and the substrate end of the ESD transistor Mesd.

In the third embodiment, the diode group D1 is equivalent to the resistor R1 in the first embodiment. However, compared with the resistor R1 in the first embodiment, the diode group D1 occupies a very small layout space, and its equivalent resistance is greatly increased, so that an extremely-low-capacitance capacitor C1 can be used to form an equivalent RC circuit together with the diode group D1. The third embodiment of the present disclosure can greatly reduce the occupied layout space and greatly reduce the capacitance while keeping the RC time constant unchanged. The ESD transistor Mesd can fully discharge the electro-static charges with the time when the static electricity is generated. Meanwhile, the leakage current is greatly reduced, and the reliability of the semiconductor device is improved.

The diode group D1 is formed by multiple diodes connected in series. For example, in the present embodiment, the diode group D1 is formed by a diode D11 and a diode D22 connected in series. In other embodiments of the present disclosure, the diode group D1 can also be formed by other numbers of diodes connected in series according to a voltage requirement of the control terminal of the ESD transistor Mesd, which is not limited in the present disclosure.

In the third embodiment, when the first pad VDD generates static electricity, that is, when static electricity is generated in a Positive-to-VSS (PS) mode, the control terminal of the static discharge transistor Mesd is at a high level, then the static discharge transistor Mesd is turned on, and the electro-static charges flow through the ESD transistor Mesd and are discharged, thereby implementing the ESD protection of the internal circuit 20 in the PS mode, and avoiding the internal circuit 20 from being damaged by the static electricity. When the second pad VSS generates static electricity, that is, when the static electricity is generated in an Negative-to-VSS (NS) mode, the static discharge transistor Mesd is turned off, the electro-static charges flow through a parasitic diode formed by the ESD transistor Mesd and are discharged, thereby implementing the ESD protection of the internal circuit 20 in the NS mode, and avoiding the internal circuit 20 from being damaged by the static electricity.

The present disclosure further provides a fourth embodiment. A difference between the fourth embodiment and the third embodiment is that the capacitor and a diode device of the electro-static pulse detection circuit 201 are connected in a different way. Specifically, referring to FIG. 5, a schematic diagram of application of an ESD protection circuit according to a fourth embodiment of the present disclosure is illustrated. In this embodiment, the electro-static pulse detection circuit 201 includes a diode group D1, a capacitor C1, and an inverter P1.

Figure 5:
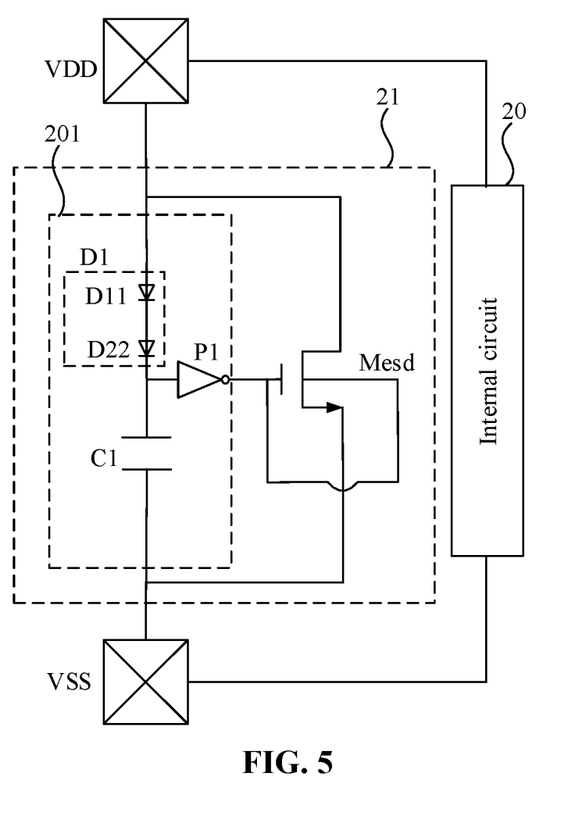
FIG. 5 is a schematic diagram of application of an ESD protection circuit according to a fourth embodiment of the present disclosure.

The diode group D1 has a first terminal and a second terminal. The second terminal of the diode group D1 serves as the upper terminal of the electro-static pulse detection circuit 201, that is, the second terminal of the diode group D1 is electrically connected to the first pad VDD. The capacitor C1 has a first terminal and a second terminal. The first terminal of the capacitor C1 serves as the lower terminal of the electro-static pulse detection circuit 201, that is, the first terminal of the capacitor C1 is electrically connected to the second pad VSS. The inverter P1 has an input terminal and an output terminal. The first terminal of the diode group D1 and the second terminal of the capacitor C1 are electrically connected to the input terminal of the inverter P1. The output terminal of the inverter P1 serves as the output terminal of the electro-static pulse detection circuit 201, that is, the output terminal of the inverter P1 is electrically connected to the control terminal and the substrate end of the ESD transistor Mesd.

In the fourth embodiment, the diode group D1 is equivalent to the resistor R1 in the second embodiment. However, compared with the resistor R1 in the second embodiment, the diode group D1 occupies a very small layout space, and its equivalent resistance is greatly increased, so that an extremely-low-capacitance capacitor C1 can be used to form an equivalent RC circuit together with the diode group D1. The fourth embodiment of the present disclosure can greatly reduce the occupied layout space and greatly reduce the capacitance while keeping the RC time constant unchanged. The ESD transistor Mesd can fully discharge the electro-static charges within the time when the static electricity is generated. Meanwhile, the leakage current is greatly reduced, and the reliability of the semiconductor device is improved.

The diode group D1 is formed by multiple diodes connected in series. For example, in the present embodiment, the diode group D1 is formed by a diode D11 and a diode D22 connected in series. In other embodiments of the present disclosure, the diode group D1 is formed by other numbers of diodes connected in series according to a voltage requirement of the control terminal of the ESD transistor Mesd, which is not limited in the present disclosure.

In the fourth embodiment, when the first pad VDD generates static electricity, that is, when static electricity is generated in a PS mode, the control terminal of the static discharge transistor Mesd is at a high level, then the static discharge transistor Mesd is conductive, and the electro-static charges flow through the ESD transistor Mesd and are discharged, thereby implementing the ESD protection of the internal circuit 20 in the PS mode, and avoiding the internal circuit 20 from being damaged by the static electricity. When the second pad VSS generates static electricity, that is, when the static electricity is generated in an NS mode, the static discharge transistor Mesd is turned off, the electro-static charges flow through a parasitic diode formed by the ESD transistor Mesd and are discharged, thereby implementing the ESD protection of the internal circuit 20 in the NS mode, and avoiding the internal circuit 20 from being damaged by the static electricity.

Figure 6:
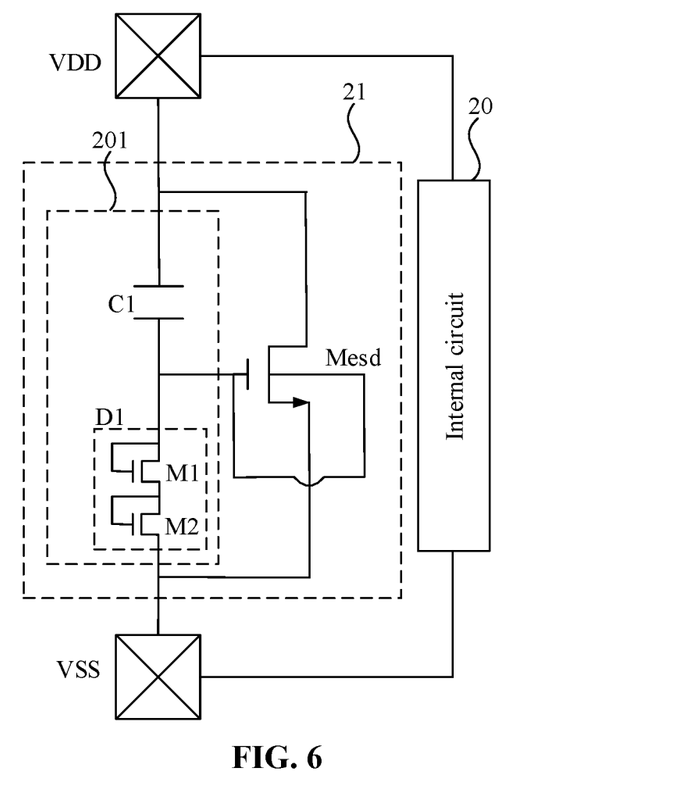
FIG. 6 is a schematic diagram of application of an ESD protection circuit according to a fifth embodiment of the present disclosure.

In the third and fourth embodiments, the diode group D1 may be formed by at least one diode connected in series, while in other embodiments of the present disclosure, the diode of the diode group is formed by a transistor with a gate and a drain which are short-circuited. Referring to FIG. 6, a schematic diagram of an ESD protection circuit according to a fifth embodiment of the present disclosure. A difference between the fifth embodiment and the third embodiment is that a diode of the diode group D1 described in the fifth embodiment is formed by a transistor with a gate and a drain which are short-circuited. Specifically, in the fifth embodiment, the diode group D1 is formed by the transistor M1 with the gate and drain being short-circuited, which is connected in series with the transistor M2 with the gate and drain being short-circuited. The transistor with the gate and drain which are short-circuited can work in a saturation region, therefore it is equivalent to a diode.

In other embodiments of the present disclosure, the diode group D1 also can be formed by other numbers of transistors with gates and drains being short-circuited connected in series according to a voltage requirement of the control terminal of the ESD transistor Mesd, which is not limited in the present disclosure.

In the fifth embodiment, the transistor M1 and the transistor M2 which work in the saturation region are connected in series, and they are equivalent to a resistor with relatively high resistance, so that a low-capacitance capacitor can be used to form an equivalent RC circuit together with the diode group D1, that is, compared with the first embodiment, the present embodiment can greatly reduce the occupied layout space while keeping the RC time constant unchanged (i.e., the ESD transistor Mesd can fully discharge the electro-static charges within the time when the static electricity is generated), so that the occupied layout space is reduced, the overall layout area can be greatly reduced, meanwhile a mode with high resistance and low capacitor is formed and the leakage current is greatly reduced.

In the fifth embodiment, the conductivity types of the transistors forming the diode group D1 are the same. For example, the transistor M1 and the transistor M2 are both NMOS transistors, or the transistor M1 and the transistor M2 are both PMOS transistors. In other embodiments of the present disclosure, the conductivity types of the transistors forming the diode group D1 are different. For example, the diode group D1 is formed by one or more NMOS transistors with their gates and respective drains being short-circuited, which are connected in series with one or more PMOS transistors with gates and drains being short-circuited.

The present disclosure further provides a sixth embodiment. A difference between the sixth embodiment and the fifth embodiment is that the capacitor of the electro-static pulse detection circuit 201 and the diode group are connected in a different way. Specifically, referring to FIG. 7, a schematic diagram of application of an ESD protection circuit according to a fourth embodiment of the present disclosure is illustrated. In this embodiment, the electro-static pulse detection circuit 201 includes a diode group D1, a capacitor C1, and an inverter P1. The diode group D1 is formed by transistors connected in series with their gates and respective drains being short-circuited. Specifically, in the sixth embodiment, the diode group D1 is formed by the transistor M1 with the gate and drain being short-circuited, which is connected in series with the transistor M2 with the gate and drain being short-circuited.

Figure 7:
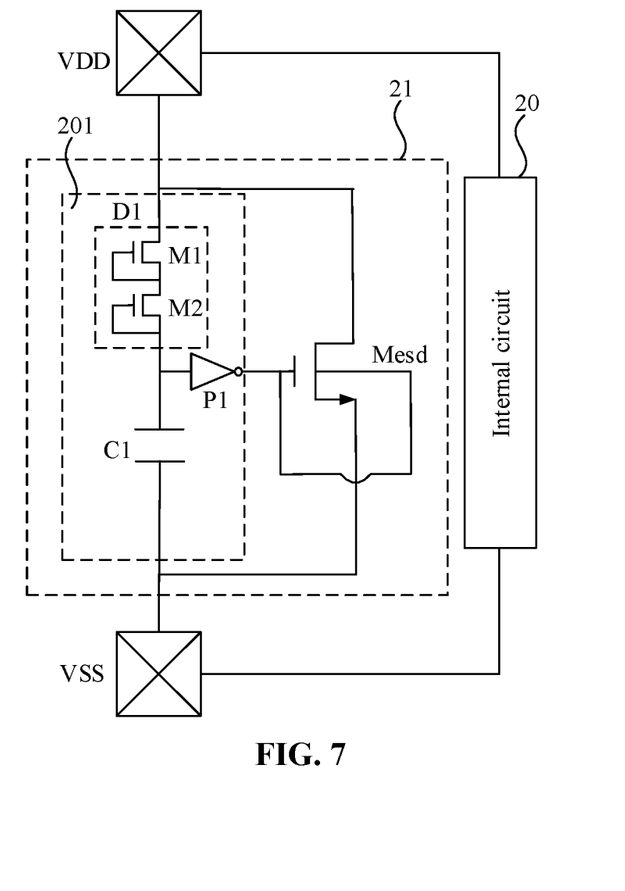
FIG. 7 is a schematic diagram of application of an ESD protection circuit according to a sixth embodiment of the present disclosure.

The diode group D1 has a first terminal and a second terminal. The second terminal of the diode group D1 serves as the upper terminal of the electro-static pulse detection circuit 201, that is, the second terminal of the diode group D1 is electrically connected to the first pad VDD. The capacitor C1 has a first terminal and a second terminal. The first terminal of the capacitor C1 serves as the lower terminal of the electro-static pulse detection circuit 201, that is, the first terminal of the capacitor C1 is electrically connected to the second pad VSS. The inverter P1 has an input terminal and an output terminal. The first terminal of the diode group D1 and the second terminal of the capacitor C1 are electrically connected to the input terminal of the inverter P1. The output terminal of the inverter P1 serves as the output terminal of the electro-static pulse detection circuit 201, that is, the output terminal of the inverter P1 is electrically connected to the control terminal and the substrate end of the ESD transistor Mesd. The ESD protection circuit of the present disclosure can avoid the false start of the ESD protection circuit, and can prolong the delay time, so that the ESD transistor Mesd can fully discharge the electro-static charges. In addition, the ESD protection circuit of the present disclosure can also greatly reduce the occupied layout space, reduce the leakage current and improve the reliability of the semiconductor device.

The present disclosure further provides a semiconductor device which uses the above-mentioned ESD protection circuit. The semiconductor device of the present disclosure can avoid false start of the ESD protection circuit. Furthermore, the electro-static pulse detection circuit is used to prolong the delay time, so that the ESD transistor fully discharges the electro-static charges, and the reliability of the semiconductor device is improved.

Figure 8:
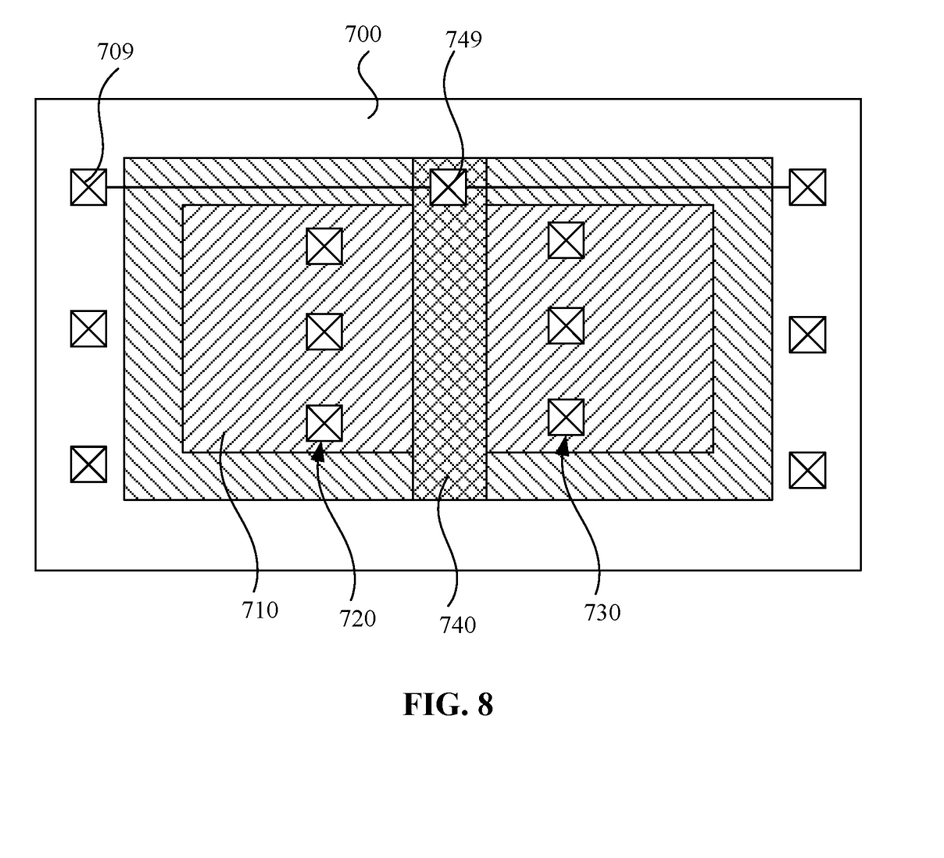
FIG. 8 is a schematic top view of a semiconductor structure that forms the ESD transistor according to a seventh embodiment of the present disclosure.

FIG. 8 is a schematic top view of a semiconductor structure that forms the ESD transistor according to a seventh embodiment of the present disclosure. Referring to FIG. 8, the semiconductor structure forming the ESD transistor includes: a semiconductor substrate 700, a well region 710, a source region 720, a drain region 730, and a gate 740.

The semiconductor substrate 700 may be a monocrystalline silicon substrate, a Ge substrate, a SiGe substrate, SOI, GOI, or the like. According to the actual requirements of the device, a suitable semiconductor material can be selected to be manufactured as the semiconductor substrate 700, which is not limited herein. Multiple connection pads 709 are provided in the semiconductor substrate 700.

The well region 710 is disposed in the semiconductor substrate 700. In the present embodiment, the ESD transistor is an NMOS transistor, and the well region is a P-type region. In other embodiments of the present disclosure, the ESD transistor is a PMOS transistor, and the well region 710 may also be an N-type region.

The source region 720 and the drain region 730 are arranged alternately at intervals in the well region 710. In the present embodiment, since the well region 710 is a P-type region, the source region 720 and the drain region 730 are N-type regions. In other embodiments of the present disclosure, if the well region 710 is an N-type region, the source region 720 and the drain region 730 are P-type regions.

The gate 740 is disposed on the semiconductor substrate 700 and located between the source region 720 and the drain region 730, and the gate 740 is electrically connected to the semiconductor substrate 700. Specifically, the gate 740 is electrically connected to the connection pad 709 of the semiconductor substrate 700 through the connection pad 749 to implement the electrical connection between the gate 740 and the semiconductor substrate 700, that is, the control terminal of the ESD transistor is electrically connected to the substrate end.

In the present embodiment, the semiconductor structure includes one source region 720, one drain region 730, and one gate 740. In other embodiments of the present disclosure, the semiconductor structure includes multiple source regions 720, multiple drain regions 730 and multiple gates 740.

Figure 9:
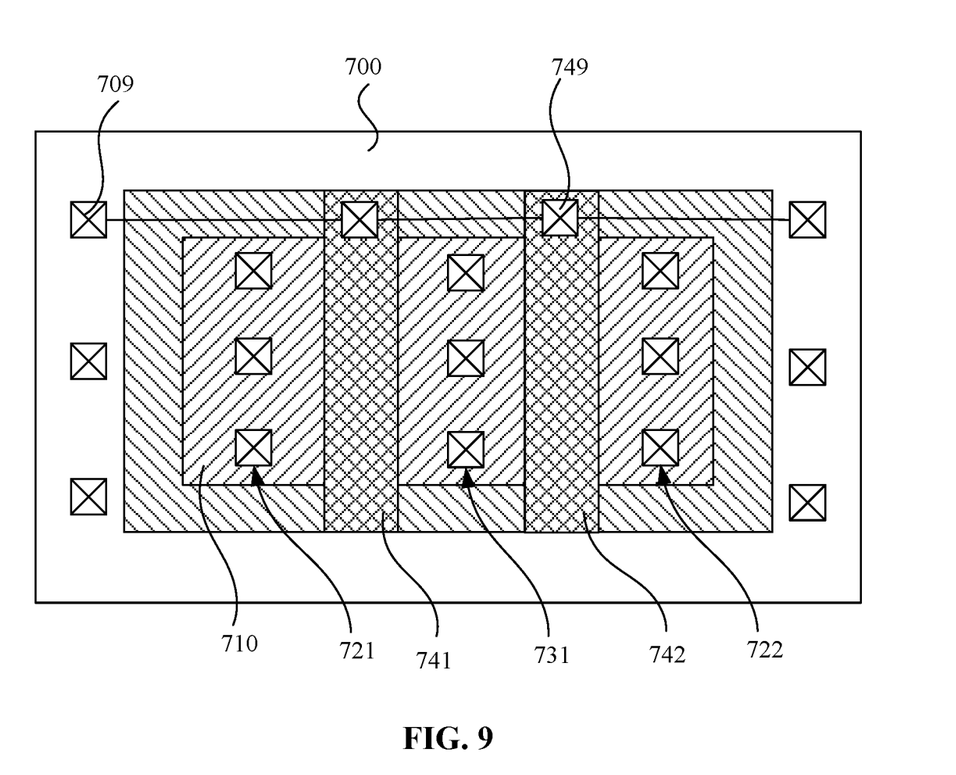
FIG. 9 is a schematic top view of a semiconductor structure that forms the ESD transistor according to an eighth embodiment of the present disclosure.

FIG. 9 is a schematic top view of a semiconductor structure that forms the ESD transistor according to an eighth embodiment of the present disclosure. Referring to FIG. 9, in the present embodiment, the semiconductor structure includes a first source region 721, a second source region 722, a first drain region 731, a first gate 741, and a second gate 742. The first drain region 731 is located between the first source region 721 and the second source region 722; the first gate 741 is located between the first source region 721 and the first drain region 731; and the second gate 742 is located between the first drain region 731 and the second source region 722. In this embodiment, the first drain region 731 serves as a shared drain region. The connection pads 749 of the first gate 741 and the second gate 742 are electrically connected to a connection pad 709 of the semiconductor substrate 700, so that the first gate 741 and the second gate 742 are electrically connected to the semiconductor substrate 700, i.e., the control terminal is electrically connected to the substrate end of the ESD transistor.

Figure 10:
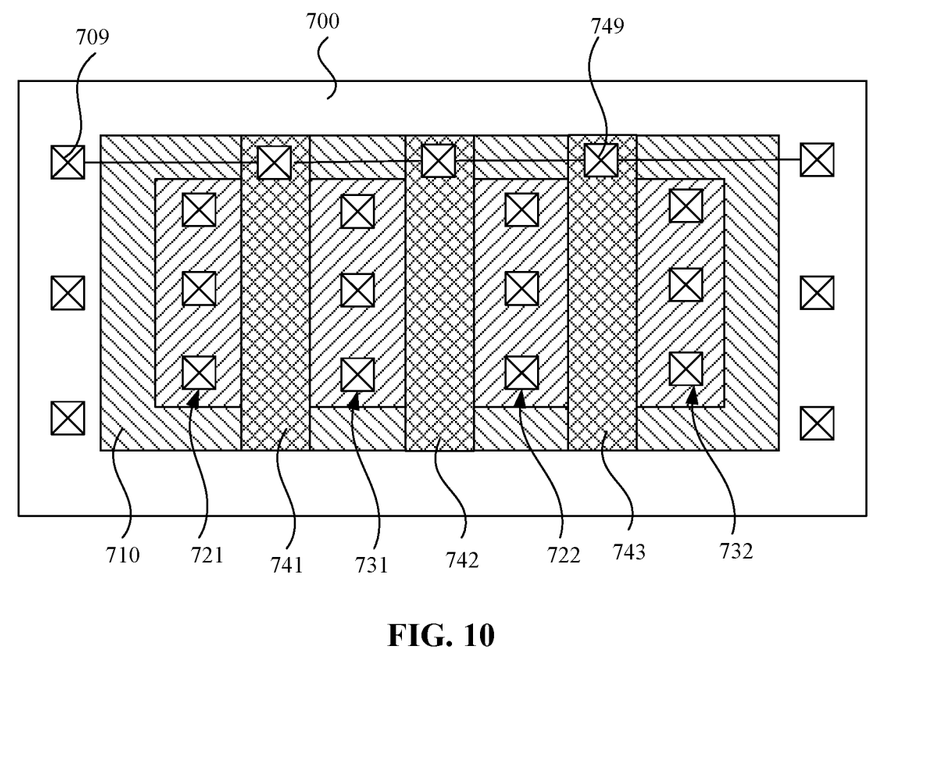
FIG. 10 is a schematic top view of a semiconductor structure that forms the ESD transistor according to a ninth embodiment of the present disclosure.

FIG. 10 is a schematic top view of a semiconductor structure that forms the ESD transistor according to a ninth embodiment of the present disclosure. Referring to FIG. 10, in this embodiment, the semiconductor structure includes multiple source regions, multiple drain regions and multiple gates, the multiple source regions and the multiple drain regions are alternately arranged at intervals, and one gate is arranged between two adjacent source region and drain region.

Figure 11:
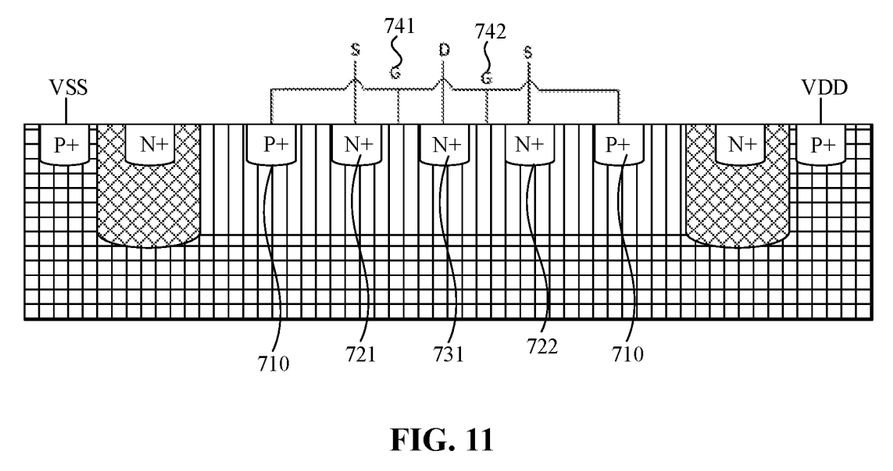
FIG. 11 is a schematic cross-sectional view of the structure shown in FIG. 9.

Specifically, in the present embodiment, the semiconductor structure includes a first source region 721, a second source region 722, a first drain region 731, a second drain region 732, a first gate 741, a second gate 742, and a third gate 743. The first source region 721, the first drain region 731, the second source region 722, and the second drain region 732 are alternately arranged at intervals. The first gate is disposed between the first source region 721 and the first drain region 731. The second gate 742 is disposed between the first drain region 731 and the second source region 722. The third gate 743 is disposed between the second source region 722 and the second drain region 732. It can be understood that in other embodiments of the present disclosure, multiple source regions, multiple drain regions, and multiple gates may also be provided according to the above-mentioned arrangement rules, and descriptions thereof are omitted herein. Taking the structure shown in FIG. 9 as an example to illustrate the principle that the ESD protection circuit of the present disclosure can enhance the discharge capacity of the electro-static charge. Referring to FIG. 11, a schematic cross-sectional view of the structure shown in FIG. 9 is illustrated. The first gate 741, the second gate 742 and the well region 710 of the ESD transistor are short-circuited. That is, the control terminal and the substrate end of the ESD transistor Mesd shown in FIG. 2 are short-circuited, and are connected to the output terminal of the electro-static pulse detection circuit 201, so that the control terminal and the substrate end of the ESD transistor Mesd are at the equipotential. Compared with a conventional ESD transistor with a control terminal and a substrate end which are not short-circuited, the ESD transistor Mesd of the present disclosure raises the potential of the substrate end, so that the threshold voltage of the ESD transistor Mesd is reduced, and the trench conductivity is enhanced. When electro-static charges are generated, the electro-static charges can be quickly discharged through the ESD transistor Mesd, which greatly enhances the discharge capacity of the electro-static charge of the ESD protection circuit.

The above descriptions are only the preferred implementations of the present disclosure. It should be noted that those of ordinary skill in the art can further make multiple improvements and retouches without departing from the principles of the present disclosure. These improvements and retouches shall also all fall within the protection scope of the present disclosure.

What is claimed is:

1. An Electro-Static Discharge (ESD) protection circuit electrically connected to a first pad and a second pad, the ESD protection circuit comprising:
    an ESD transistor having a control terminal, a first terminal electrically connected to the first pad, a second terminal electrically connected to the second pad, and a substrate end; and
    an electro-static pulse detection circuit having an upper terminal electrically connected to the first pad, a lower terminal electrically connected to the second pad, and an output terminal electrically connected to the control terminal and the substrate end,
    wherein the electro-static pulse detection circuit comprises:
    a capacitor having a first terminal serving as the upper terminal of the electro-static pulse detection circuit, and a second terminal; and
    a diode group having a first terminal serving as the lower terminal of the electro-static pulse detection circuit, and a second terminal serving as the output terminal of the electro-static pulse detection circuit together with the second terminal of the capacitor,
    wherein the first pad is connected to a power supply, and the second pad is grounded.

2. The ESD protection circuit of claim 1, wherein the ESD transistor is a Negative channel Metal Oxide Semiconductor (NMOS) transistor.

3. The ESD protection circuit of claim 1, wherein the diode group is formed by multiple diodes connected in series.

4. The ESD protection circuit of claim 3, wherein the diode group is formed by a transistor with a gate and a drain which are short-circuited.

5. The ESD protection circuit of claim 4, wherein the transistor is an NMOS transistor or a Positive channel Metal Oxide Semiconductor (PMOS) transistor.

6. The ESD protection circuit of claim 5, wherein the diode group is formed by at least one NMOS transistor with a gate and a drain being short-circuited, which is connected in series with at least one PMOS transistor with a gate and a drain being short-circuited.

7. A semiconductor device, comprising an Electro-Static Discharge (ESD) protection circuit electrically connected to a first pad and a second pad, wherein the ESD protection circuit comprises:
    an ESD transistor having a control terminal, a first terminal electrically connected to the first pad, a second terminal electrically connected to the second pad, and a substrate end; and
    an electro-static pulse detection circuit having an upper terminal electrically connected to the first pad, a lower terminal electrically connected to the second pad, and an output terminal electrically connected to the control terminal and the substrate end of the ESD transistor,
    wherein the electro-static pulse detection circuit comprises:
    a capacitor having a first terminal serving as the upper terminal of the electro-static pulse detection circuit, and a second terminal; and
    a diode group having a first terminal serving as the lower terminal of the electro-static pulse detection circuit, and a second terminal serving as the output terminal of the electro-static pulse detection circuit together with the second terminal of the capacitor,
    wherein the first pad is connected to a power supply, and the second pad is grounded.

8. The semiconductor device of claim 7, wherein a semiconductor structure that forms the ESD transistor comprises:
    a semiconductor substrate;
    a well region disposed in the semiconductor substrate;
    a source region and a drain region which are arranged alternately at intervals and arranged in the well region; and
    a gate disposed on the semiconductor substrate and located between the source region and the drain region, the gate being electrically connected to the semiconductor substrate.

9. The semiconductor device of claim 8, wherein the well region is a P-type region, and the source region and the drain region are N-type regions.

10. The semiconductor device of claim 8, wherein the semiconductor structure comprises a first source region, a second source region, a first drain region, a first gate, and a second gate, wherein the first drain region is located between the first source region and the second source region; the first gate is located between the first source region and the first drain region; and the second gate is located between the first drain region and the second source region.

11. The semiconductor device of claim 8, wherein the semiconductor structure comprises a plurality of source regions, a plurality of drain regions and a plurality of gates, wherein the plurality of source regions and the plurality of drain regions are arranged alternately at intervals, and the gate is arranged between two adjacent source region and drain region.

12. The semiconductor device of claim 7, wherein the ESD transistor is a Negative channel Metal Oxide Semiconductor (NMOS) transistor.

13. The semiconductor device of claim 7, wherein the diode group is formed by multiple diodes connected in series.

14. The semiconductor device of claim 13, wherein the diode group is formed by a transistor with a gate and a drain which are short-circuited.

15. The semiconductor device of claim 14, wherein the transistor is an NMOS transistor or a Positive channel Metal Oxide Semiconductor (PMOS) transistor.

16. The semiconductor device of claim 15, wherein the diode group is formed by at least one NMOS transistor with a gate and a drain being short-circuited, which is connected in series with at least one PMOS transistor with a gate and a drain being short-circuited.

* * * * *